(12) United States Patent
Fukasawa

(10) Patent No.: US 11,296,273 B2
(45) Date of Patent: Apr. 5, 2022

(54) PIEZOELECTRIC COMPOSITION AND PIEZOELECTRIC DEVICE

(71) Applicant: TDK Corporation, Tokyo (JP)

(72) Inventor: Kazuki Fukasawa, Tokyo (JP)

(73) Assignee: TDK Corporation, Tokyo (JP)

( * ) Notice: Subject to any disclaimer, the term of this patent is extended or adjusted under 35 U.S.C. 154(b) by 146 days.

(21) Appl. No.: 16/715,010

(22) Filed: Dec. 16, 2019

(65) Prior Publication Data

US 2020/0203596 A1 Jun. 25, 2020

(30) Foreign Application Priority Data

Dec. 21, 2018 (JP) .............................. JP2018-239913

(51) Int. Cl.
| | | |
|---|---|---|
| *H01L 41/187* | (2006.01) | |
| *C04B 35/26* | (2006.01) | |
| *C04B 35/626* | (2006.01) | |
| *C04B 35/634* | (2006.01) | |
| *C04B 35/64* | (2006.01) | |
| *C04B 35/638* | (2006.01) | |

(52) U.S. Cl.
CPC .......... *H01L 41/1878* (2013.01); *C04B 35/26* (2013.01); *C04B 35/2683* (2013.01); *C04B 35/6262* (2013.01); *C04B 35/638* (2013.01); *C04B 35/63416* (2013.01); *C04B 35/64* (2013.01); *H01L 41/1871* (2013.01); *C04B 2235/3236* (2013.01); *C04B 2235/3274* (2013.01); *C04B 2235/408* (2013.01); *C04B 2235/604* (2013.01); *C04B 2235/6567* (2013.01); *C04B 2235/768* (2013.01)

(58) Field of Classification Search
CPC ............. H01L 41/1878; H01L 41/1871; C04B 35/2683; C04B 2235/768; C04B 2235/408; C04B 2235/3274; C04B 2235/3236
See application file for complete search history.

(56) References Cited

U.S. PATENT DOCUMENTS

| | | |
|---|---|---|
| 2011/0221302 A1 | 9/2011 | Yabuta et al. |
| 2014/0178290 A1 | 6/2014 | Yabuta et al. |

FOREIGN PATENT DOCUMENTS

| | | |
|---|---|---|
| JP | 2009-298621 A | 12/2009 |
| JP | 6146453 B2 | 6/2017 |

OTHER PUBLICATIONS

Wei, Yongxing et.al., "Dielectric, Ferroelectric, and Piezoelectric Properties of $BiFeO_3$-$BaTiO_3$ Ceramics," Journal of the American Ceramic Society, 2013, vol. 96, Issue 10, p. 3163-p. 3168.

*Primary Examiner* — C Melissa Koslow

(74) *Attorney, Agent, or Firm* — Faegre Drinker Biddle & Reath LLP

(57) ABSTRACT

A piezoelectric composition comprises silver and an oxide containing bismuth, barium, iron, and titanium. The oxide has a perovskite structure. The mass of the oxide is represented by $M_{ABO3}$ and the mass of the silver is represented by $M_{AG}$. $100 \times M_{AG}/M_{ABO3}$ is 0.01 or more and 10.00 or less.

6 Claims, 2 Drawing Sheets

PIEZOELECTRIC COMPOSITION AND PIEZOELECTRIC DEVICE

TECHNICAL FIELD

The present invention relates to a piezoelectric composition and a piezoelectric device.

BACKGROUND

Most of the piezoelectric compositions currently in practical use are solid solutions (so-called PZT-based piezoelectric compositions) consisting of lead zirconate ($PbZrO_3$) and lead titanate ($PbTiO_3$). The PZT-based piezoelectric compositions contain a large amount of lead oxide (PbO) as a main component. Since lead oxide is extremely volatile even at low temperatures, a large amount of lead oxide diffuses into the air during the producing process of a piezoelectric composition or a piezoelectric device using the same. Since lead is an environmental pollutant that harms the human body, there is a need for a piezoelectric composition that does not contain lead.

A representative piezoelectric composition containing no lead is bismuth ferrite ($BiFeO_3$). For example, Patent Literature 1 and Non-Patent Literature 1 below disclose solid solutions consisting of $BiFeO_3$ and barium titanate ($BaTiO_3$) (BFO-BTO-based piezoelectric composition). However, since the electrical resistivity of the conventional BFO-BTO-based piezoelectric composition is small and a leakage current is likely to occur in the BFO-BTO-based piezoelectric composition, the conventional BFO-BTO-based piezoelectric composition does not necessarily have sufficient piezoelectricity. For example, the piezoelectric constant $d_{33}$ of the BFO-BTO-based piezoelectric composition after the polarization process is about 135 pC/N. The following Patent Literature 2 discloses a method for producing a dielectric ceramic from a powder containing $BiFeO_3$, $Bi_2Fe_4O_9$, and $Bi_{25}FeO_{39}$. According to the producing method, the leakage current in the dielectric ceramic (piezoelectric composition) is reduced. However, the following Patent Literature 2 does not report a specific piezoelectric constant of the dielectric ceramic.

[Patent Literature 1] Japanese Unexamined Patent Publication No. 2009-298621

[Patent Literature 2] Japanese Patent No. 6146453

[Non-Patent Literature 1] Wei et. al, Dielectric, Ferroelectric, and Piezoelectric Properties of $BiFeO_3$—$BaTiO_3$ Ceramics, J. Am. Ceram. Soc., 96 [10] (2013) 3163-3168.

SUMMARY

Technical Problem

An object of the present invention is to provide a piezoelectric composition having a high electrical resistivity and a large piezoelectric constant, and a piezoelectric device comprising the piezoelectric composition.

Solution to Problem

A piezoelectric composition according to an aspect of the present invention comprises silver and an oxide containing bismuth, barium, iron, and titanium, the oxide has a perovskite structure, the mass of the oxide is represented by $M_{ABO3}$, the mass of silver is represented by $M_{AG}$, and $100 \times M_{AG}/M_{ABO3}$ is 0.01 or more and 10.00 or less.

The piezoelectric composition according to an aspect of the present invention may further comprise at least one element D selected from the group consisting of vanadium, niobium, tantalum, molybdenum, tungsten, and manganese.

The piezoelectric composition according to an aspect of the present invention may further comprise at least niobium as an element D.

The total mass of the element D may be represented by $M_D$, and $100 \times M_D/M_{ABO3}$ may be 0.00 or more and 5.00 or less.

At least part of the above oxide may be represented by $x[Bi_mFeO_3]$-$y[Ba_nTiO_3]$, x may be 0.6 or more and 0.8 or less, y may be 0.2 or more and 0.4 or less, x+y may be 1, m may be 0.96 or more and 1.06 or less, and n may be 0.96 or more and 1.06 or less.

A piezoelectric device according to an aspect of the present invention comprises the piezoelectric composition described above.

Advantageous Effects of Invention

According to the present invention, there is provided a piezoelectric composition having a high electrical resistivity and a large piezoelectric constant, and a piezoelectric device comprising the piezoelectric composition.

DETAILED DESCRIPTION

Hereinafter, preferred embodiments of the present invention will be described with reference to the drawings. The present invention is not limited to the following embodiments.

Figure 1:
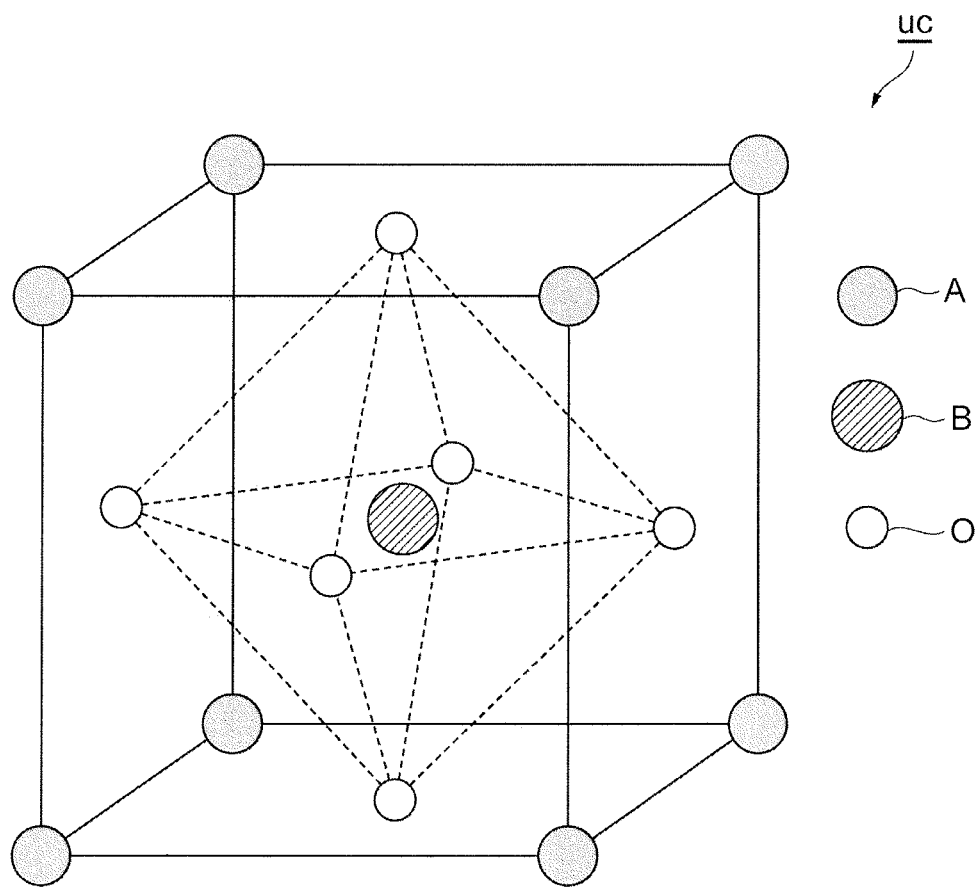
FIG. 1 is a perspective view of a unit cell of a perovskite structure of an oxide contained in a piezoelectric composition according to an embodiment of the present invention.

The piezoelectric composition according to the present embodiment comprises silver (Ag) and an oxide containing bismuth (Bi), barium (Ba), iron (Fe), and titanium (Ti). For the convenience of description, oxides containing Bi, Ba, Fe, and Ti will be denoted as "BFO-BTO." BFO-BTO has a perovskite structure. BFO-BTO may include at least one crystal selected from the group consisting of tetragonal crystals having a perovskite structure, cubic crystals having a perovskite structure, and rhombohedral crystals having a perovskite structure. An example of a unit cell having a perovskite structure is shown in FIG. 1. The unit cell uc may consist of element A at site A, element B at site B, and oxygen (O). The element A may be Bi or Ba. The element B may be Fe or Ti.

The mass of the oxide (BFO-BTO) is represented by $M_{ABO3}$. The mass of Ag is represented by $M_{AG}$. $M_{AG}$ may otherwise be referred to as the mass of Ag alone. $100 \times M_{AG}/M_{ABO3}$ is 0.01 or more and 10.00 or less. When $100 \times M_{AG}/M_{ABO3}$ is 0.01 or more and 10.00 or less, it is possible for the piezoelectric composition to have a high electrical resistivity ($\rho$) and a large piezoelectric constant ($d_{33}$). The reason is as follows.

Part of oxygen constituting the perovskite structure of BFO-BTO is likely to be lost. That is, oxygen vacancies are likely to be generated in the perovskite structure. The loss of part of oxygen constituting the perovskite structure is represented by the following Formula 1, for example. Two electrons (e⁻) are generated as one oxygen vacancy ($V_O''$) is generated. Therefore, in a case where the piezoelectric composition contains oxygen vacancies, a leakage current caused by the oxygen vacancies is likely to occur in the piezoelectric composition. In other words, the electrical resistivity of the piezoelectric composition containing oxygen vacancies is low. As a result, it is difficult to apply a high voltage to the piezoelectric composition such that the piezoelectric composition is not sufficiently polarized, and thus it is difficult for the piezoelectric composition to have a large piezoelectric constant. However, since the piezoelectric composition according to the present embodiment comprises Ag, part of Ba at site A of the perovskite structure of BFO-BTO is substituted with Ag. The substitution of Ba with Ag is represented by the following Formula 2, for example. $Ag_{BA}$ in Formula 2 represents Ag at site A of the perovskite structure replacing Ba. Since the valence of Ba constituting the perovskite structure is 2 and the valence of Ag is 1, a hole (h⁺) is generated with the substitution of Ba with Ag. When $100 \times M_{AG}/M_{ABO3}$ is 0.01 or more and 10.00 or less, the electrons caused by the oxygen vacancies and the holes caused by Ag are easily balanced. That is, Ag functions as an electron acceptor. As a result, the electrical resistivity of the piezoelectric composition is higher than the electrical resistivity of the piezoelectric composition in which $100 \times M_{AG}/M_{ABO3}$ is outside the above range, and the leakage current in the piezoelectric composition is suppressed. Therefore, it is possible to apply a high voltage to the piezoelectric composition such that the piezoelectric composition is sufficiently polarized, and thus it is possible for the piezoelectric composition to have a large piezoelectric constant. For example, when $100 \times M_{AG}/M_{ABO3}$ is within the above range, it is possible for the piezoelectric composition to have $d_{33}$ of 140 pC/N or more. In a case where $100 \times M_{AG}/M_{ABO3}$ is less than 0.01, it is difficult to sufficiently cancel out the electrons caused by the oxygen vacancies with the holes caused by Ag. In a case where $100 \times M_{AG}/M_{ABO3}$ is larger than 10.00 as well, it is difficult to balance charges in the piezoelectric composition such that the crystal structure (perovskite structure) of BFO-BTO is easily damaged by excessive Ag, and thus the piezoelectric constant of the piezoelectric composition is likely to decrease. In view of facilitating the piezoelectric composition to have a high electrical resistivity and a large piezoelectric constant, $100 \times M_{AG}/M_{ABO3}$ may be preferably 0.01 or more and 5.00 or less, and more preferably 0.01 or more and 0.50 or less. If the piezoelectric composition does not comprise Ag and comprises copper (Cu) having a valence of 2, it is difficult for the piezoelectric composition to have a high electrical resistivity, and also difficult to have a large piezoelectric constant. However, the piezoelectric composition may comprise Cu in addition to Ag. The voltage applied to the piezoelectric composition may otherwise be referred to as electric field.

$$O \rightarrow V_O'' + 2e^- \qquad (1)$$

$$Ag \rightarrow Ag_{BA} + h^+ \qquad (2)$$

The piezoelectric composition may further comprise at least one element D selected from the group consisting of vanadium (V), niobium (Nb), tantalum (Ta), molybdenum (Mo), tungsten (W), and manganese (Mn). The piezoelectric composition may comprise Multiple kinds of elements D. The valence of the element D is 5 or 6. For example, the valence of each of vanadium, niobium, and tantalum is 5. The valence of each of molybdenum, tungsten, and manganese is 6. When the piezoelectric composition comprises at least one kind of element D, the electrical resistivity (ρ) of the piezoelectric composition is likely to increase, and the piezoelectric constant ($d_{33}$) of the piezoelectric composition is likely to increase. The reason is as follows. However, even in a case where the piezoelectric composition does not comprise the element D, it is possible for the piezoelectric composition to have a high electrical resistivity and a large piezoelectric constant by comprising Ag.

Since Bi easily volatilizes, part of Bi at site A of the perovskite structure may be lost in the producing process of the piezoelectric composition. That is, in the perovskite structure, Bi vacancies may be generated. The loss of part of Bi constituting the perovskite structure is represented by the following Formula 3, for example. Since the valence of Bi constituting the perovskite structure is 3, three holes (h⁺) are generated as one Bi vacancy ($V_{BI}'''$) is generated. Therefore, in a case where the piezoelectric composition includes Bi vacancies, a leakage current caused by holes is likely to occur in the piezoelectric composition. In other words, when the piezoelectric composition includes Bi vacancies, the electrical resistivity of the piezoelectric composition is likely to decrease. As a result, it is difficult to apply a high voltage to the piezoelectric composition such that it is difficult for the piezoelectric composition to be sufficiently polarized, and thus it is difficult to increase the piezoelectric constant of the piezoelectric composition. The valence of Fe ions constituting the perovskite structure of BFO-BTO is 3. However, the valence of Fe ions may decrease during the producing process of the piezoelectric composition. The decrease in the valence of Fe ions is represented, for example, by the following Formula 4. Since the valence of Fe constituting the perovskite structure is 3, one hole (h⁺) is generated as the valence of Fe decreases. Therefore, as the valence of Fe decreases, a leakage current caused by the holes is likely to occur in the piezoelectric composition. In other words, as the valence of Fe decreases, the electrical resistivity of the piezoelectric composition is likely to decrease. As a result, it is difficult to apply a high voltage to the piezoelectric composition such that it is difficult for the piezoelectric composition to be sufficiently polarized, and thus it is difficult to increase the piezoelectric constant of the piezoelectric composition. On the other hand, in a case where the piezoelectric composition comprises the element D, part of the element at site B of the perovskite structure of BFO-BTO is substituted with the element D. The element at site B is, for example, Ti. In a case where the valence of the element D is 5, the substitution of Ti with the element D is represented by the following Formula 5, for example. In a case where the valence of the ion of the element D is 6, the substitution of Ti with the element D is represented by the following Formula 6, for example. $D_{TI}$ in the Formulas 4 and 5 is the element D at site B of the perovskite structure replacing Ti. Since the valence of Ti constituting the perovskite structure is 4 and the valence of the element D is 5 or 6, an electron(s) (e⁻) is (are) generated with the substitution of Ti with the element D. Therefore, the holes caused by Bi vacancies, the holes caused by a decrease in the valence of Fe, and the electrons derived from the element D are easily balanced. That is, the element D functions as an electron donor. As a result, the electrical resistivity of the piezoelectric composition is likely to increase as compared with the electrical resistivity of the piezoelectric composition not comprising the element D, and the leakage current in the piezoelectric composition is likely to be suppressed. Therefore, it is easy to apply a high voltage to the piezoelectric composition such that the piezoelectric composition is sufficiently easily polarized, and the piezoelectric composition is likely to have a large piezoelectric constant.

$$Bi \rightarrow V_{Bi}'''+3h^+ \quad (3)$$

$$Fe^{3+} \rightarrow Fe^{2+}+h^+ \quad (4)$$

$$D \rightarrow D_{Ti}+e^- \quad (5)$$

$$D \rightarrow D_{Ti}+2e^- \quad (6)$$

The piezoelectric composition may further comprise at least niobium as the element D. The piezoelectric composition comprising niobium is likely to have a higher electrical resistivity than a piezoelectric composition comprising the element D other than niobium. Therefore, the piezoelectric composition comprising niobium is likely to have a larger piezoelectric constant than a piezoelectric composition comprising the element D other than niobium.

The total mass of the element D may be represented by $M_D$, and $100 \times M_D/M_{ABO3}$ may be 0.00 or more and 5.00 or less. The $M_D$ may otherwise be referred to as the total mass of the element D alone. When $100 \times M_D/M_{ABO3}$ is 0.00 or more and 5.00 or less, the holes caused by Bi vacancies, the holes caused by the decrease in the valence of Fe, and the electrons derived from the element D are easily balanced. As a result, the electrical resistivity of the piezoelectric composition is likely to increase as compared with the electrical resistivity of the piezoelectric composition in which $100 \times M_D/M_{ABO3}$ is outside the above range, and the leakage current in the piezoelectric composition is likely to be suppressed. Therefore, it is easy to apply a high voltage to the piezoelectric composition such that the piezoelectric composition is sufficiently easily polarized, and the piezoelectric composition is likely to have a large piezoelectric constant. For example, when $100 \times M_D/M_{ABO3}$ is within the above range, it is possible for the piezoelectric composition to have $d_{33}$ of 150 pC/N or more. In view of facilitating the piezoelectric composition to have a high electrical resistivity and a large piezoelectric constant, $100 \times M_D/M_{ABO3}$ may be preferably 0.01 or more and 1.00 or less, and more preferably 0.01 or more and 0.10 or less.

The reason why the piezoelectric composition has a high electrical resistivity and a large piezoelectric constant is not necessarily limited to the above mechanism.

At least part of the oxide (BFO-BTO) may be represented by the following Chemical Formula A. The following Chemical Formula A is equal to Chemical Formula B.

$$x[Bi_mFeO_3]-y[Ba_nTiO_3] \quad (A)$$

$$(Bi_{xm}Ba_{yn})(Fe_xTi_y)O_3 \quad (B)$$

x+y is 1. x may be 0.6 or more and 0.9 or less, or 0.6 or more and 0.8 or less. y may be 0.1 or more and 0.4 or less, or 0.2 or more and 0.4 or less. m may be 0.96 or more and 1.06 or less. n may be 0.96 or more and 1.06 or less. In a case where x is 0.6 or more and 0.8 or less and y is 0.2 or more and 0.4 or less, the piezoelectric composition is likely to have a high electrical resistivity and a large piezoelectric constant.

The above $M_{ABO3}$ is a calculational value of the mass of $x[Bi_mFeO_3]-y[Ba_nTiO_3]$ based on the assumption that all of the elements of Bi, Fe, Ba, and Ti contained in the piezoelectric composition constitute the only oxide represented by Chemical Formula A. That is, $M_{ABO3}$ is a calculational value for defining $100 \times M_{AG}/M_{ABO3}$. Part of Ba or Bi in Chemical Formula A or Chemical Formula B may actually be substituted with Ag. Part of Ti or Fe in Chemical Formula A or Chemical Formula B may be substituted with the element D. That is, the oxide containing Bi, Ba, Fe, and Ti may further contain Ag. The oxide containing Bi, Ba, Fe, and Ti may further contain both Ag and the element D. The piezoelectric composition may consist of only one oxide consisting of Bi, Fe, Ba, Ti, Ag, and O. The piezoelectric composition may consist of only one oxide consisting of Bi, Fe, Ba, Ti, Ag, the element D, and O. Part of the piezoelectric composition may be a phase consisting of $Bi_mFeO_3$. Part of the piezoelectric composition may be a phase consisting of $Ba_nTiO_3$. The piezoelectric composition may contain an element other than Bi, Fe, Ba, Ti, Ag, the element D, and O as impurities or additives. For example, the piezoelectric composition may comprise at least one selected from the group consisting of sodium (Na), potassium (K), magnesium (Mg), aluminum (Al), sulfur (S), zirconium (Zr), silicon (Si), phosphorus (P), copper (Cu), Zinc (Zn), and hafnium (Hf). The piezoelectric composition according to the present embodiment may not comprise Pb. However, the piezoelectric composition comprising Pb is not necessarily excluded from the technical scope of the present embodiment.

The average composition of the entire piezoelectric composition may be analyzed, for example, by an X-ray fluorescence method (XRF method) or inductively coupled plasma (ICP) emission spectroscopy. The structure of the piezoelectric composition may be specified by an X-ray diffraction (XRD) method.

Figure 2:
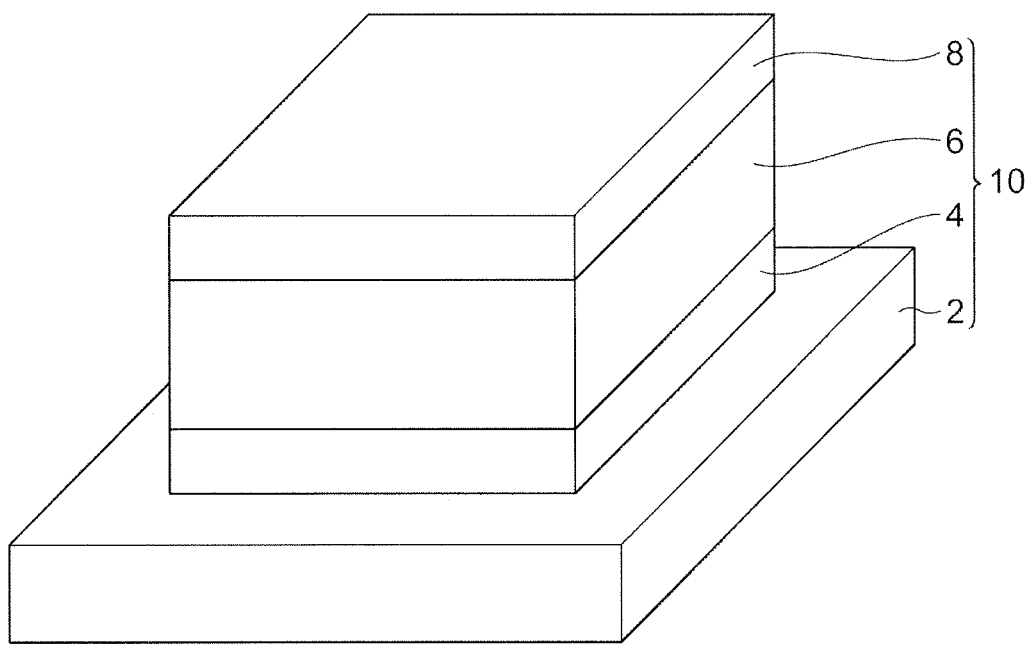
FIG. 2 is a schematic perspective view of a piezoelectric device according to an embodiment of the present invention.

As shown in FIG. 2, a piezoelectric device 10 according to the present embodiment comprises a substrate 2, a first electrode 4 stacked on a surface of the substrate 2, a piezoelectric body 6 stacked on a surface of the first electrode 4, and a second electrode 8 stacked on a surface of the piezoelectric body 6. The piezoelectric body 6 contains the above piezoelectric composition according to the present embodiment. The piezoelectric body 6 may be a sintered body of the piezoelectric composition. The piezoelectric body 6 may include another component in addition to the piezoelectric composition. The piezoelectric body 6 shown in FIG. 2 is a thin rectangular parallelepiped, but the shape and dimensions of the piezoelectric body 6 are not limited. The substrate 2 may be a metal, a semiconductor, a resin, glass, or ceramics, for example. As long as the first electrode 4 and the second electrode 8 have electroconductivity, the composition of each of the first electrode 4 and the second electrode 8 is not limited. Each of the first electrode 4 and the second electrode 8 may be a metal simple substance or an alloy. Each of the first electrode 4 and the second electrode 8 may be a metal oxide having electroconductivity.

Applications of the piezoelectric device according to the present embodiment are diverse. The piezoelectric device may be, for example, a piezoelectric microphone, a piezoelectric transformer, a harvester, an oscillator, a resonator, or an acoustic multilayer film. The piezoelectric device may be, for example, a piezoelectric actuator. The piezoelectric actuator may be used for haptics. That is, the piezoelectric actuator may be used for various devices that require feedback based on skin sensation (tactile sense). The devices that require feedback based on skin sensation may be, for example, a wearable device, a touch pad, a display, or a game controller. The piezoelectric actuator may be used for a head assembly, a head stack assembly, or a hard disk drive. The piezoelectric actuator may be used for, for example, a printer head or an inkjet printer apparatus. The piezoelectric actuator may be used for a piezoelectric switch. The piezoelectric device may be, for example, a piezoelectric sensor. The piezoelectric sensor may be used for, for example, a gyro sensor, a pressure sensor, a pulse wave sensor, an ultrasonic sensor, or a shock sensor. The piezoelectric devices described above may be part or all of the MEMS.

The piezoelectric composition according to the present embodiment may be produced by the following producing method.

In the production of the piezoelectric composition, a raw material powder (raw material particles) is prepared from a starting material. A green compact is formed by press molding of the raw material particles. A sintered body is obtained by sintering the green compact. A piezoelectric body is obtained by subjecting the sintered body to polarization process. The piezoelectric composition according to the present embodiment means both the sintered body before the polarization process and the sintered body after the polarization process. Hereinafter, details of the steps are as follows.

In the granulation step, the starting material of the piezoelectric composition is weighed. Multiple kinds of starting materials may be used. The starting materials contain Bi, Fe, Ba, Ti, and Ag. The starting materials may further contain the element D. The starting materials may be a simple substance (metal) or a compound of the elements. The compound may be, for example, an oxide, carbonate, hydroxide, oxalate, or nitrate. The starting materials may be a solid (for example, a powder). The molar ratio of Bi, Fe, Ba, and Ti in the entire starting material may be adjusted to the molar ratio of Bi, Fe, Ba, and Ti in the above Chemical Formula A by the weighing of each starting material. The mass of Ag in the entire starting materials may be adjusted such that $100 \times M_{AG}/M_{ABO3}$ is 0.01 or more and 10.00 or less. The total mass of the element D in the entire starting material may be adjusted such that $100 \times M_D/M_{ABO3}$ is 0.00 or more and 5.00 or less.

The bismuth compound (Bi compound) may be bismuth oxide ($Bi_2O_3$), bismuth nitrate ($Bi(NO_3)_3$), or the like. The iron compound (Fe compound) may be iron oxide ($Fe_2O_3$), iron chloride ($FeCl_3$), iron nitrate ($Fe(NO_3)_3$), or the like. The barium compound (Ba compound) may be barium oxide (BaO), barium carbonate ($BaCO_3$), barium oxalate ($BaC_2O_4$), barium acetate ($(CH_3COO)_2Ba$), barium nitrate ($Ba(NO_3)_2$), barium sulfate ($BaSO_4$), barium titanate ($BaTiO_3$), or the like. The titanium compound (Ti compound) may be titanium oxide ($TiO_2$) or the like. The compound of Ag may be $Ag_2O$ (silver oxide). The compound of the element D may be an oxide of the element D. The oxide of the element D may be, for example, at least one selected from the group consisting of vanadium oxide ($V_2O_5$), niobium oxide ($Nb_2O_5$), tantalum oxide ($Ta_2O_5$), molybdenum oxide ($MoO_3$), tungsten oxide ($WO_3$), and manganese oxide ($MnO_3$).

In the granulation step, raw material particles are prepared from the starting materials described above. Multiple kinds of raw material particles having different compositions may be prepared. The preparation method of the raw material particles may be as follows, for example.

A slurry may be prepared by mixing the starting materials and a solvent. The starting materials in the slurry may be pulverized by wet mixing of the slurry using a ball mill or the like. The solvent used for the preparation of the slurry may be water, for example. The solvent may be an alcohol such as ethanol. The solvent may be a mixture of water and ethanol. The starting materials after the wet mixing may be dried by a spray dryer or the like.

A temporary green compact is formed by molding the mixture of the pulverized starting material. A temporary sintered body is obtained by heating (calcining) the temporary green compact in an oxidizing atmosphere. The oxidizing atmosphere may be air, for example. The calcination temperature may be 700° C. or more and 1050° C. or less. The calcination time may be about 1 to 3 hours. Raw material particles are obtained by pulverization of the temporary sintered body. A slurry may be prepared by mixing the raw material particles and a solvent. The raw material particles in the slurry may be pulverized by wet mixing of the slurry using a ball mill or the like. The average value of the primary particle diameter of the raw material particles may be adjusted by this wet mixing. The average value of the primary particle diameter of the raw material particles may be, for example, 0.01 μm or more and 20 μm or less. The raw material particles after the wet mixing may be dried by a spray dryer or the like.

A green compact is obtained by press molding of a mixture of the raw material particles and a binder. The binder may be an organic binder such as polyvinyl alcohol or ethyl cellulose. A dispersant may be added to the binder.

A sintered body is obtained by sintering the green compact in an oxidizing atmosphere. Before the green compact is sintered, a binder removal process may be performed on the green compact. That is, the binder in the green compact may be decomposed by heating the green compact. The binder removal process and sintering may be performed continuously. The binder removal process and sintering may be performed separately. The sintering temperature may be 900° C. or more and 1250° C. or less. The sintering time may be 1 hour or more and 8 hours or less.

Prior to the polarization process described later, a thin plate consisting of the sintered body may be formed by cutting the sintered body. A surface of the thin plate of the sintered body may be subjected to lapping. A cutting machine such as a cutter, a slicer, or a dicing saw may be used for cutting the sintered body. After the lapping, a temporary electrode for polarization process is formed on each of a pair of opposed surfaces of the sintered body. The temporary electrode may be formed by a vacuum deposition method or sputtering. The temporary electrode is easily removed by an etching process using a ferric chloride solution or the like.

In the polarization process, a polarization electric field is applied between a pair of temporary electrodes sandwiching the sintered body. In the polarization process, the sintered body may be heated. The temperature of the sintered body in the polarization process may be 80° C. or more and 300° C. or less. The time for which the polarization electric field is applied may be 1 minute or more and 30 minutes or less. The polarization electric field may be 0.9 times or more of the coercive electric field of the sintered body.

After the polarization process, the temporary electrodes are removed from the sintered body. A piezoelectric composition (piezoelectric body) having a desired shape may be formed by processing the sintered body.

Although the preferred embodiments of the present invention have been described above, the present invention is not necessarily limited to the above-described embodiments. The piezoelectric composition according to the present invention may be, for example, a piezoelectric thin film.

EXAMPLES

Hereinafter, the present invention will be described in detail by Examples and Comparative Examples. However, the present invention is not limited to the following Examples.

Example 1

$Bi_2O_3$ powder, $Fe_2O_3$ powder, $BaCO_3$ powder, $TiO_2$ powder, and Ag (metal simple substance) powder were used as the starting materials. $BaCO_3$, $TiO_2$, $Bi_2O_3$, and $Fe_2O_3$ were weighed such that the molar ratio of Bi, Fe, Ba, and Ti in the entire starting material was the same as the molar ratio of Bi, Fe, Ba, and Ti in the following Chemical Formula A1. In the case of Example 1, the values of x and y in Chemical Formula A1 were those shown in Table 1 below. Ag was weighed such that $100 \times M_{AG}/M_{ABO3}$ was 5.2. $M_{AG}$ is the mass of Ag included in the starting material. $M_{ABO3}$ is a calculational value of the mass of $x[BiFeO_3]$-$y[BaTiO_3]$ based on the assumption that all of the elements of Bi, Fe, Ba, and Ti included in the starting materials constitute the only oxide represented by the following Chemical Formula A1. In the following, $100 \times M_{AG}/M_{ABO3}$ is expressed as α.

$x[BiFeO_3]$-$y[BaTiO_3]$ (A1)

All of the starting materials and pure water were mixed in a ball mill for 10 hours. After drying the mixed starting materials, a temporary green compact was obtained by press molding of the starting materials. The temporary sintered body was obtained by heating the temporary green compact at 800° C. The temporary sintered body was pulverized by a ball mill. Raw material particles were obtained by drying the pulverized temporary sintered body. A green compact was obtained by press molding of a mixture of the raw material particles and a binder (polyvinyl alcohol). The binder was removed by heating the green compact. After the binder removal process, the green compact was sintered in the air at 1000° C. for 4 hours to obtain a sintered body. The sintered body corresponds to the piezoelectric composition before the polarization process.

A plate consisting of the sintered body was formed by processing the sintered body using a double-sided lapping machine and a dicing saw. The dimension of the sintered body after processing was 16 mm long×16 mm wide×0.5 mm thick.

Using a vacuum deposition apparatus, electrodes consisting of Ag were formed on both sides of the sintered body. The thickness of each electrode was 1.5 μm. The dimension of each electrode was 15 mm×15 mm.

The electrical resistivity ρ (unit: 0.1 cm) of the piezoelectric composition was measured by applying a direct current electric field to the piezoelectric composition sandwiched between the pair of electrodes. The direct current electric field was 0.1 kV/cm. The time for which the direct current electric field was applied to the piezoelectric composition was 40 seconds. ρ of Example 1 is shown in Table 1.

The sintered body was polarized by applying the electric field to the sintered body sandwiched between the pair of electrodes. The strength of the electric field applied to the sintered body was 1.5 to 2 times that of the coercive electric field. The electric field was applied to the sintered body for 15 minutes. The above polarization process was performed in a silicon oil bath at a temperature of 120° C. After the polarization process, the electrical resistivity ρ of the piezoelectric composition was measured again. The electrical resistivity ρ of the piezoelectric composition of Example 1 after the polarization process was $1 \times 10^{12}$ Ω·cm or more. In the cases of Examples 2 to 28 to be described later as well, the electrical resistivity ρ of the piezoelectric composition after the polarization process was $1 \times 10^{12}$ Ω·cm or more.

The piezoelectric composition of Example 1 was obtained by the above method. As a result of the analysis based on the X-ray fluorescence method, the molar ratio of Bi, Fe, Ba, and Ti in the piezoelectric composition coincided with the molar ratio of Bi, Fe, Ba, and Ti in the above Chemical Formula A1. The values of x and y in Chemical Formula A1 coincided with the values shown in Table 1 below. The mass ratio α of Ag in the piezoelectric composition coincided with the values shown in Table 1 below. The X-ray diffraction pattern confirmed that the piezoelectric composition had a perovskite structure.

The piezoelectric constant $d_{33}$ (unit: pC/N) of the piezoelectric composition of Example 1 was measured using a $d_{33}$ meter. The $d_{33}$ meter is an apparatus for measuring $d_{33}$ by the Berlincourt method in accordance with JIS (Japan Industrial Standards) R 1696. In the Berlincourt method, $d_{33}$ is measured by utilizing the positive piezoelectric effect when vibration is applied to the piezoelectric composition. Therefore, in the Berlincourt method, unlike the measurement method utilizing the inverse piezoelectric effect when an electric field is applied to the piezoelectric composition, there is no influence of electrostriction, and the original $d_{33}$ of the piezoelectric composition can be obtained. $d_{33}$ of Example 1 was a value shown in Table 1 below.

Examples 2 to 28

The x, y, and α of each of Examples 2 to 28 were adjusted to the values shown in Tables 1 to 3 below by weighing the starting materials.

In Examples 3 to 28, an oxide of the element D was further used as a starting material. The element D of each of Examples 3 to 28 is shown in Tables 1 to 3 below. In any cases of Examples 3 to 28, $100 \times M_D/M_{ABO3}$ was adjusted to a predetermined value by weighing the oxide of the element D. $M_D$ is the total mass of the element D included in the starting material. In the following, $100 \times M_D/M_{ABO3}$ is expressed as β. β of each of Examples 3 to 28 is shown in Tables 1 to 3 below. Since the element D was not used in Example 2, β of Example 2 was zero.

The piezoelectric composition of each of Examples 2 to 28 was produced in the same manner as in Example 1 except for the above-described matters.

The piezoelectric composition of each of Examples 2 to 28 was analyzed in the same manner as in Example 1. In any cases of Examples 2 to 28, the molar ratio of Bi, Fe, Ba, and Ti in the piezoelectric composition coincided with the molar ratio of Bi, Fe, Ba, and Ti in the above Chemical Formula A1. In any cases of Examples 2 to 28, the values of x and y in Chemical Formula A1 coincided with the values shown in Tables 1 to 3 below. In any cases of Examples 2 to 28, the mass ratio α of Ag in the piezoelectric composition coincided with the value shown in Tables 1 to 3 below. In any cases of Examples 2 to 28, the mass ratio β of the element D in the piezoelectric composition coincided with the value shown in Tables 1 to 3 below. In any cases of Examples 2 to 28, it was confirmed that the piezoelectric composition had a perovskite structure.

The electrical resistivity ρ of the piezoelectric compositions of each of Examples 2 to 28 was measured in the same manner as in Example 1. ρ before polarization process of each of Examples 2 to 28 is shown in Tables 1 to 3. The piezoelectric constant $d_{33}$ of the piezoelectric compositions of each of Examples 2 to 28 was measured in the same manner as in Example 1. $d_{33}$ of each of Examples 2 to 28 is shown in Tables 1 to 3 below.

Comparative Examples 1 to 8

In any cases of Comparative Examples 1 to 8, Ag was not used as a starting material. In the weighing of the starting materials of each of Comparative Examples 1 to 8, x, y, and β were adjusted to the values shown in Table 4 below. Since the oxide of the element D was not used in Comparative Example 1, β of Comparative Example 1 was zero.

The piezoelectric composition of each of Comparative Examples 1 to 8 was produced in the same manner as in Example 1 except for the above-described matters.

The piezoelectric composition of each of Comparative Examples 1 to 8 was analyzed in the same manner as in Example 1. In any cases of Comparative Examples 1 to 8, the molar ratio of Bi, Fe, Ba, and Ti in the piezoelectric composition coincided with the molar ratio of Bi, Fe, Ba, and Ti in the above Chemical Formula A1. In any cases of Comparative Examples 1 to 8, the values of x and y in Chemical Formula A1 coincided with the values shown in Table 4 below. In any cases of Comparative Examples 1 to 8, the mass ratio α of Ag in the piezoelectric composition was zero. In any cases of Comparative Examples 1 to 8, the mass ratio β of the element D in the piezoelectric composition coincided with the value shown in Table 4 below. In any cases of Comparative Example 1 to 8, it was confirmed that the piezoelectric composition had a perovskite structure.

The electrical resistivity ρ of the piezoelectric compositions of each of Comparative Examples 1 to 8 was measured in the same manner as in Example 1. ρ before the polarization process of each of Comparative Examples 1 to 8 is shown in Table 4. The piezoelectric constant $d_{33}$ of the piezoelectric composition of each of Comparative Examples 1 to 8 was measured in the same manner as in Example 1. $d_{33}$ of each of Comparative Examples 1 to 8 is shown in Table 4 below.

A, B, C, and D described in the evaluation columns of Tables 1 to 4 below are defined as follows. A means that ρ is $1.0 \times 10^{12}$ Ω·cm or more (1E+12 Ω·cm or more) and $d_{33}$ is 160 pC/N or more. B means that ρ is $1.0 \times 10^{12}$ Ω·cm or more and $d_{33}$ is 150 pC/N or more and less than 160 pC/N. C means that ρ is $1.0 \times 10^{12}$ Ω·cm or more and $d_{33}$ is 140 pC/N or more and less than 150 pC/N. D means that ρ is less than $1.0 \times 10^{12}$ Ω·cm and $d_{33}$ is less than 140 pC/N.

TABLE 1

|  | BiFeO$_3$ | BaTiO$_3$ | Ag | Element D | | Resistivity | Piezoelectric constant | Evaluation |
|---|---|---|---|---|---|---|---|---|
|  | x | y | α | Type | β | ρ[Ω·cm] | $d_{33}$ [pC/N] | — |
| Example 1 | 0.9 | 0.1 | 5.2 | — | 0 | 1.0E+12 | 141 | C |
| Example 2 | 0.9 | 0.1 | 1.2 | — | 0 | 1.1E+12 | 145 | C |
| Example 3 | 0.69 | 0.31 | 0.01 | Nb | 0.01 | 2.8E+12 | 195 | A |
| Example 4 | 0.69 | 0.31 | 0.01 | Nb | 0.02 | 3.0E+12 | 196 | A |
| Example 5 | 0.69 | 0.31 | 0.01 | Nb | 0.05 | 3.0E+12 | 198 | A |
| Example 6 | 0.69 | 0.31 | 0.01 | Nb | 0.1 | 8.9E+12 | 210 | A |
| Example 7 | 0.69 | 0.31 | 0.01 | Nb | 0.2 | 4.2E+12 | 203 | A |
| Example 8 | 0.67 | 0.33 | 0.01 | Nb | 1 | 2.1E+12 | 190 | A |
| Example 9 | 0.66 | 0.34 | 0.01 | Nb | 0.05 | 2.7E+12 | 196 | A |
| Example 10 | 0.71 | 0.29 | 0.01 | Nb | 0.5 | 3.9E+12 | 203 | A |

TABLE 2

|  | BiFeO$_3$ | BaTiO$_3$ | Ag | Element D | | Resistivity | Piezoelectric constant | Evaluation |
|---|---|---|---|---|---|---|---|---|
|  | x | y | α | Type | β | ρ[Ω·cm] | $d_{33}$ [pC/N] | — |
| Example 11 | 0.7 | 0.3 | 0.1 | Nb | 0.1 | 2.0E+12 | 190 | A |
| Example 12 | 0.73 | 0.27 | 0.1 | Nb | 0.2 | 1.2E+12 | 180 | A |
| Example 13 | 0.66 | 0.34 | 0.2 | Nb | 0.2 | 1.3E+12 | 185 | A |
| Example 14 | 0.7 | 0.3 | 0.2 | Nb | 1 | 1.2E+12 | 180 | A |
| Example 15 | 0.7 | 0.3 | 0.5 | Nb | 0.01 | 1.0E+12 | 175 | A |
| Example 16 | 0.7 | 0.3 | 0.5 | Nb | 1 | 1.2E+12 | 177 | A |
| Example 17 | 0.7 | 0.3 | 1 | Nb | 0.01 | 1.0E+12 | 160 | A |
| Example 18 | 0.7 | 0.3 | 1 | Nb | 0.5 | 1.0E+12 | 161 | A |
| Example 19 | 0.7 | 0.3 | 1 | Nb | 1 | 1.1E+12 | 168 | A |
| Example 20 | 0.7 | 0.3 | 5 | Nb | 5 | 1.0E+12 | 162 | A |

TABLE 3

|  | BiFeO$_3$ | BaTiO$_3$ | Ag | Element D | | Resistivity | Piezoelectric constant | Evaluation |
|---|---|---|---|---|---|---|---|---|
|  | x | y | α | Type | β | ρ[Ω·cm] | $d_{33}$ [pC/N] | — |
| Example 21 | 0.7 | 0.3 | 10 | Nb | 5 | 1.0E+12 | 151 | B |
| Example 22 | 0.8 | 0.2 | 0.01 | Nb | 0.1 | 4.0E+12 | 160 | A |
| Example 23 | 0.6 | 0.4 | 0.01 | Nb | 0.1 | 2.6E+12 | 164 | A |
| Example 24 | 0.69 | 0.31 | 0.01 | Ta | 0.1 | 3.0E+12 | 172 | A |
| Example 25 | 0.69 | 0.31 | 0.01 | Mo | 0.1 | 3.5E+12 | 176 | A |
| Example 26 | 0.69 | 0.31 | 0.01 | Mn | 0.1 | 3.3E+12 | 173 | A |
| Example 27 | 0.69 | 0.31 | 0.01 | W | 0.1 | 2.8E+12 | 168 | A |
| Example 28 | 0.69 | 0.31 | 0.01 | V | 0.1 | 2.8E+12 | 170 | A |

TABLE 4

|  | BiFeO$_3$ | BaTiO$_3$ | Ag | Element D | | Resistivity | Piezoelectric constant | Evaluation |
|---|---|---|---|---|---|---|---|---|
|  | x | y | α | Type | β | ρ[Ω·cm] | d$_{33}$ [pC/N] | — |
| Comparative Example 1 | 0.68 | 0.32 | 0 | — | 0 | 7.6E+10 | 135 | D |
| Comparative Example 2 | 0.69 | 0.31 | 0 | Nb | 0.5 | 9.0E+10 | 122 | D |
| Comparative Example 3 | 0.69 | 0.31 | 0 | Nb | 5.1 | 7.0E+10 | 100 | D |
| Comparative Example 4 | 0.69 | 0.31 | 0 | Ta | 5.1 | 1.0E+05 | 0 | D |
| Comparative Example 5 | 0.69 | 0.31 | 0 | Mo | 5.1 | 1.3E+05 | 0 | D |
| Comparative Example 6 | 0.69 | 0.31 | 0 | Mn | 5.1 | 1.7E+06 | 0 | D |
| Comparative Example 7 | 0.69 | 0.31 | 0 | W | 5.1 | 1.5E+06 | 0 | D |
| Comparative Example 8 | 0.69 | 0.31 | 0 | V | 5.1 | 1.0E+06 | 0 | D |

INDUSTRIAL APPLICABILITY

The piezoelectric composition according to the present invention can be used for, for example, a piezoelectric actuator.

REFERENCE SIGNS LIST

2 . . . substrate, 4 . . . first electrode, 6 . . . piezoelectric body (piezoelectric composition), 8 . . . second electrode, uc . . . unit cell of perovskite structure.

What is claimed is:

1. A piezoelectric composition comprising:
an oxide containing bismuth, barium, iron, and titanium and silver,
wherein the oxide has a perovskite structure,
$M_{ABO3}$ is a calculational value of a mass of $x[Bi_mFeO_3]$-$y[Ba_nTiO_3]$ based on an assumption that all of elements of bismuth, barium, iron, and titanium contained in the piezoelectric composition constitute only the $x[Bi_mFeO_3]$-$y[Ba_nTiO_3]$,
x is 0.6 or more and 0.9 or less,
y is 0.1 or more and 0.4 or less,
x+y is 1,
m is 0.96 or more and 1.06 or less,
n is 0.96 or more and 1.06 or less,
a mass of the silver is represented by $M_{AG}$, and
$100 \times M_{AG}/M_{ABO3}$ is 0.01 or more and 10.00 or less.

2. The piezoelectric composition according to claim 1, further comprising:
at least one element D selected from the group consisting of vanadium, niobium, tantalum, molybdenum, tungsten, and manganese.

3. The piezoelectric composition according to claim 1, further comprising:
at least niobium as an element D.

4. The piezoelectric composition according to claim 2, wherein a total mass of the element D is represented by $M_D$, and
$100 \times M_D/M_{ABO3}$ is 0.01 or more and 5.00 or less.

5. The piezoelectric composition according to claim 1, wherein at least part of the oxide is represented by $x[Bi_mFeO_3]$-$y[Ba_nTiO_3]$ in which a part of at least one of Bi and Ba is substituted with Ag,
x is 0.6 or more and 0.8 or less, and
y is 0.2 or more and 0.4 or less.

6. A piezoelectric device comprising:
the piezoelectric composition according to claim 1.

* * * * *